United States Patent
Lee et al.

(10) Patent No.: US 9,580,800 B2
(45) Date of Patent: Feb. 28, 2017

(54) METHOD FOR OPERATING SEMICONDUCTOR MANUFACTURING EQUIPMENT

(71) Applicant: SAMSUNG ELECTRONICS CO., LTD., Suwon-Si, Gyeonggi-Do (KR)

(72) Inventors: Byoung-Hoon Lee, Suwon-si (KR); June-Hee Lee, Hwaseong-si (KR); Geun-Woo Kim, Seoul (KR); Min-Woo Song, Seongnam-si (KR); Seok-Jun Won, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

(21) Appl. No.: 14/600,132

(22) Filed: Jan. 20, 2015

(65) Prior Publication Data

US 2015/0252470 A1    Sep. 10, 2015

(30) Foreign Application Priority Data

Mar. 5, 2014    (KR) .................. 10-2014-0026096

(51) Int. Cl.
| | | |
|---|---|---|
| G01R 31/26 | (2014.01) | |
| H01L 21/66 | (2006.01) | |
| C23C 16/44 | (2006.01) | |
| C23C 16/32 | (2006.01) | |
| C23C 16/34 | (2006.01) | |
| H01L 21/67 | (2006.01) | |

(52) U.S. Cl.
CPC .......... *C23C 16/4404* (2013.01); *C23C 16/32* (2013.01); *C23C 16/34* (2013.01); *H01L 21/67005* (2013.01); *G01B 2210/56* (2013.01)

(58) Field of Classification Search
None
See application file for complete search history.

(56) References Cited

U.S. PATENT DOCUMENTS

| | | | |
|---|---|---|---|
| 7,232,492 B2* | 6/2007 | Won .................... | C23C 16/4404 134/1 |
| 2004/0011286 A1 | 1/2004 | Kwon | |
| 2004/0013818 A1* | 1/2004 | Moon ................. | C23C 16/4405 427/576 |
| 2004/0180553 A1 | 9/2004 | Park et al. | |
| 2009/0315093 A1 | 12/2009 | Li et al. | |
| 2011/0244693 A1 | 10/2011 | Tamura et al. | |

FOREIGN PATENT DOCUMENTS

| | | |
|---|---|---|
| JP | 2009-249680 | 10/2009 |
| JP | 2013-008770 | 1/2013 |
| KR | 0601034 | 7/2006 |
| KR | 2008-0105539 A | 12/2008 |
| KR | 2009-0025053 A | 3/2009 |
| KR | 2010-0036848 A | 4/2010 |
| KR | 2010-0051994 A | 5/2010 |
| KR | 2010-0112838 A | 10/2010 |

* cited by examiner

*Primary Examiner* — Sonya D McCall Shepard
(74) *Attorney, Agent, or Firm* — Volentine & Whitt, PLLC

(57) ABSTRACT

A method for operating semiconductor manufacturing equipment is provided. The method includes forming a conductive thin film on an inner side surface of a reaction chamber and on a substrate in the reaction chamber, the conductive thin film including a first conductive material, and forming a particle preventive layer on the inner side surface of the reaction chamber in which the conductive thin film is formed.

14 Claims, 6 Drawing Sheets

METHOD FOR OPERATING SEMICONDUCTOR MANUFACTURING EQUIPMENT

CROSS-REFERENCE TO RELATED APPLICATIONS

A claim of priority under 35 U.S.C. §119 is made to Korean Patent Application No. 10-2014-0026096 filed on Mar. 5, 2014, the entire contents of which are hereby incorporated by reference.

BACKGROUND

The inventive concept relates to a method for operating semiconductor manufacturing equipment, and more particularly to a method for operating semiconductor manufacturing equipment, which can improve productivity of semiconductors.

In producing semiconductors, the stopping time of semiconductor manufacturing equipment exerts a severe influence on the productivity of semiconductors. That is, while semiconductor manufacturing equipment is in a stopped state, semiconductor production is not performed.

Semiconductor manufacturing equipment may include a reaction chamber for forming a thin film on a semiconductor substrate. If particles that exceed a controllable level are detected on the thin film that is formed using the semiconductor manufacturing equipment, the semiconductor substrate on which the particles that exceed the controllable level are detected may not be used to produce a semiconductor device. In this case, the productivity of semiconductors may be lowered.

Recently, as semiconductor devices gradually become more miniaturized, particles that fall on a semiconductor substrate during formation of a thin film may directly cause process inferiority.

SUMMARY

Embodiments of the inventive concept provide a method for operating semiconductor manufacturing equipment, which can improve production yield by preventing particles from falling on a substrate during formation of a conductive thin film by forming a particle prevention layer on an inner side surface of a reaction chamber in which the conductive thin film that is used as a gate electrode material is formed.

Additional advantages, subjects, and features of the inventive concept will be set forth in part in the description which follows and in part will become apparent to those having ordinary skill in the art upon examination of the following or may be learned from practice of the inventive concept.

In embodiments of the inventive concept, there is provided a method for operating semiconductor manufacturing equipment including forming a conductive thin film on an inner side surface of a reaction chamber and on a substrate in the reaction chamber, the conductive thin film including a first conductive material, and forming a particle preventive layer on the inner side surface of the reaction chamber in which the conductive thin film is formed.

The first conductive material may include at least one of a metal alloy and a metal carbide.

A metal included in the metal alloy and the metal carbide may include at least one of Al, Ti, Ta, W, Ni, Nb, Mo, Hf, and La.

The particle preventive layer may include a second conductive material.

The second conductive material may include a metal nitride.

A first metal included in the metal nitride may include at least one of Al, Ti, Ta, W, Ni, Nb, Mo, Hf and La.

The first conductive material may include at least one of a metal alloy including a second metal, and a metal carbide including the second metal, and the second metal may be the same as the first metal.

The first conductive material may include a TiAlC and the second conductive material may include TiN.

The forming of the conductive thin film may include loading the substrate on a substrate loading portion in the reaction chamber before forming the conductive thin film, unloading the substrate on which the conductive thin film is formed from the substrate loading portion after forming the conductive thin film, and drawing the substrate out of the reaction chamber, and the forming of the particle preventive layer may include forming the particle preventive layer, after once performing a process including loading the substrate, forming the conductive thin film, and unloading the substrate.

The forming of the conductive thin film may include loading the substrate on a substrate loading portion in the reaction chamber before forming the conductive thin film, unloading the substrate on which the conductive thin film is formed from the substrate loading portion after forming the conductive thin film, and drawing the substrate out of the reaction chamber, and the forming of the particle preventive layer may include forming the particle preventive layer on an n times repeatedly deposited conductive thin film, after forming the n times repeatedly deposited conductive thin film on the inner side surface of the reaction chamber by n times repeating a process including loading the substrate, forming the conductive thin film, and unloading the substrate, where n is a natural number that is equal to or larger than 2.

The method may further include setting the value n to m-1 if particles in the reaction chamber are generated to exceed a level of control after m times repeating the process including loading the substrate, forming the conductive thin film, and unloading the substrate, and m is a natural number that is equal to or larger than 3.

The method may further include loading a dummy substrate in the reaction chamber between the forming of the conductive thin film and the forming of the particle preventive layer, and the forming of the particle preventive layer may further include forming the particle preventive layer on the dummy substrate.

In some embodiments of the inventive concept, none of dry cleaning may be performed before and/or after forming the conductive thin film.

The semiconductor manufacturing equipment may be one of atomic layer deposition equipment and chemical vapor deposition equipment.

In another embodiment of the inventive concept, there is provided a method for operating semiconductor manufacturing equipment including loading a first substrate on a substrate loading portion in a reaction chamber, forming a first TiAlC layer on an inner side surface of the reaction chamber and a first substrate in the reaction chamber, unloading the first substrate on which the first TiAlC layer is formed from the substrate loading portion to draw the first substrate out of the reaction chamber, loading a first dummy substrate on the substrate loading portion, and forming a first TiN layer on the first TiAlC layer formed on the inner side surface of the reaction chamber and the first dummy substrate.

The method may further include unloading the first dummy substrate on which the first TiN layer is formed from the substrate loading portion to draw the first dummy substrate out of the reaction chamber, loading a second substrate on the substrate loading portion in the reaction chamber, forming a second TiAlC layer on the inner side surface of the reaction chamber and the second substrate in the reaction chamber, unloading the second substrate on which the second TiAlC layer is formed from the substrate loading portion to draw the second substrate out of the reaction chamber, loading a second dummy substrate on the substrate loading portion, and forming a second TiN layer on the inner side surface of the reaction chamber, in which the first TiAlC layer, the first TiN layer and the second TiAlC layer are successively formed, and the second dummy substrate.

The method may further include between the drawing of the first substrate to an outside and the loading of the first dummy substrate, loading a second substrate on the substrate loading portion in the reaction chamber, forming a second TiAlC layer on the inner side surface of the reaction chamber and the second substrate in the reaction chamber, and unloading the second substrate on which the second TiAlC layer is formed from the substrate loading portion to draw the second substrate out of the reaction chamber, and the first TiN layer is formed on the inner side surface of the reaction chamber in which the first TiAlC layer and the second TiAlC layer are successively formed.

In other embodiments of the inventive concept, there is provided a method for operating semiconductor manufacturing equipment including loading a first substrate on a substrate loading portion in a reaction chamber, forming a first TiAlC layer on an inner side surface of the reaction chamber and a first substrate in the reaction chamber by an atomic layer deposition process, unloading the first substrate on which the first TiAlC layer is formed from the substrate loading portion to draw the first substrate out of the reaction chamber, loading a first dummy substrate on the substrate loading portion, and forming a first TiN layer on the first TiAlC layer formed on the inner side surface of the reaction chamber and the first dummy substrate by an atomic layer deposition process.

The method may further include unloading the first dummy substrate on which the first TiN layer is formed from the substrate loading portion to draw the first dummy substrate out of the reaction chamber, loading a second substrate on the substrate loading portion in the reaction chamber, forming a second TiAlC layer on the inner side surface of the reaction chamber and the second substrate in the reaction chamber by an atomic layer deposition process, unloading the second substrate on which the second TiAlC layer is formed from the substrate loading portion to draw the second substrate out of the reaction chamber, loading a second dummy substrate on the substrate loading portion, and forming a second TiN layer on the inner side surface of the reaction chamber, in which the first TiAlC layer, the first TiN layer and the second TiAlC layer are successively formed, and the second dummy substrate by an atomic layer deposition process.

The method may further include between the drawing of the first substrate to an outside and the loading of the first dummy substrate, loading a second substrate on the substrate loading portion in the reaction chamber, forming a second TiAlC layer on the second substrate in the reaction chamber by an atomic layer deposition process, and unloading the second substrate on which the second TiAlC layer is formed from the substrate loading portion to draw the second substrate out of the reaction chamber, and the first TiN layer is formed on the inner side surface of the reaction chamber in which the first TiAlC layer and the second TiAlC layer are successively formed.

The method may further include between the drawing of the first substrate to an outside and the loading of the second substrate, measuring the number of particles during forming the first TiAlC layer.

BRIEF DESCRIPTION OF THE DRAWINGS

The above and other objects, features and advantages of the inventive concept will be more apparent from the following detailed description taken in conjunction with the accompanying drawings, in which.

DETAILED DESCRIPTION OF THE EMBODIMENTS

Figure 1:
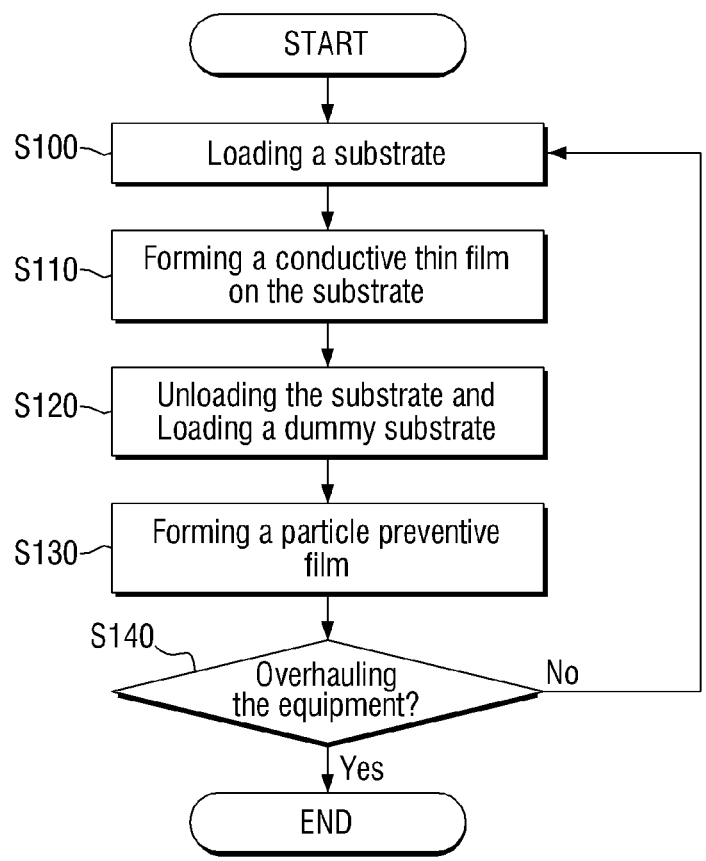
FIG. 1 is a flowchart explaining a method for operating semiconductor manufacturing equipment according to an embodiment of the inventive concept.

The inventive concept will now be described more fully hereinafter with reference to the accompanying drawings, in which preferred embodiments of the inventive concept are shown. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, and so on may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinafter, referring to FIGS. 1 to 4, a method for operating semiconductor manufacturing equipment according to an embodiment of the inventive concept will be described.

Figure 2:
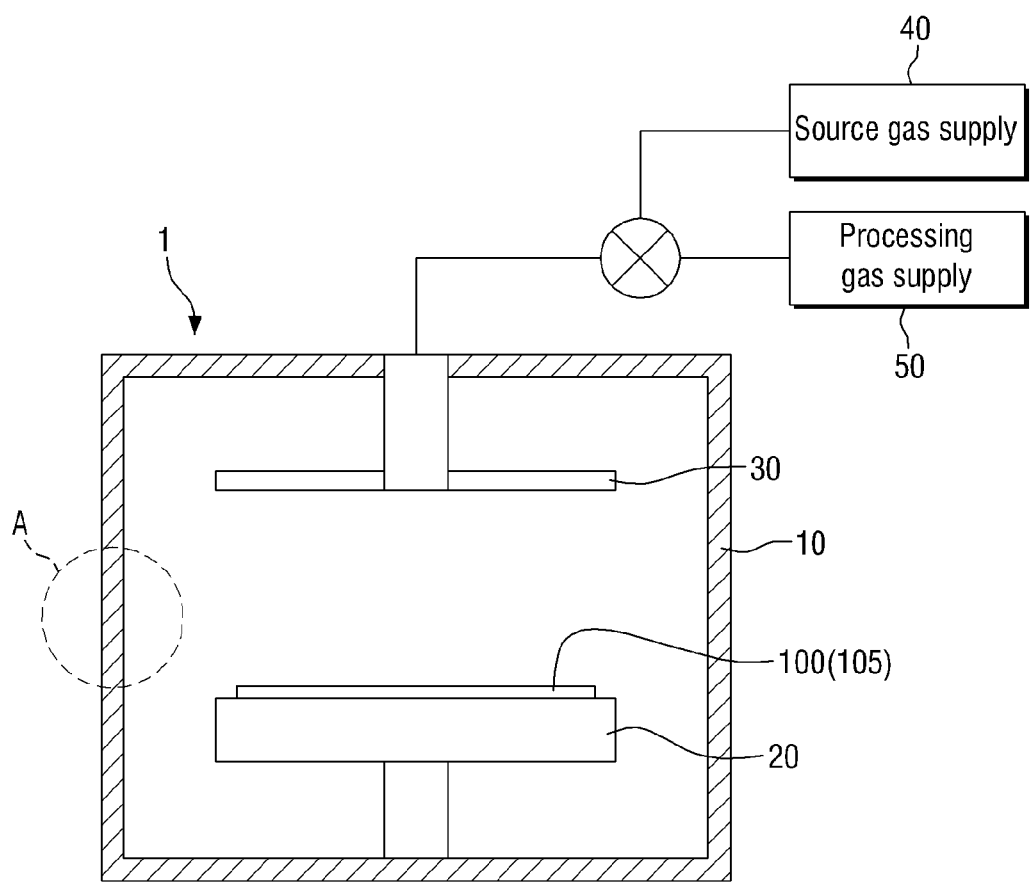
FIG. 2 is a conceptual cross-sectional view of semiconductor manufacturing equipment according to an embodiment of the inventive concept.
Figure 3:
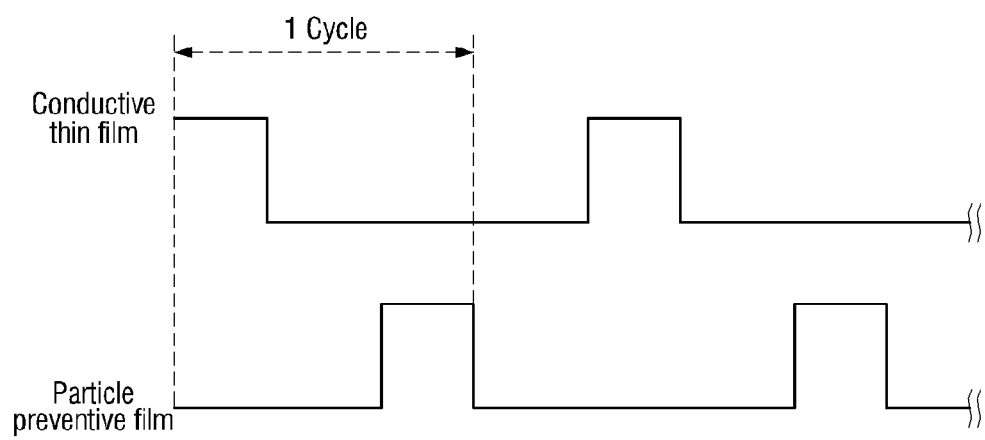
FIG. 3 is a timing diagram explaining a method for operating semiconductor manufacturing equipment according to an embodiment of the inventive concept.
Figure 4:
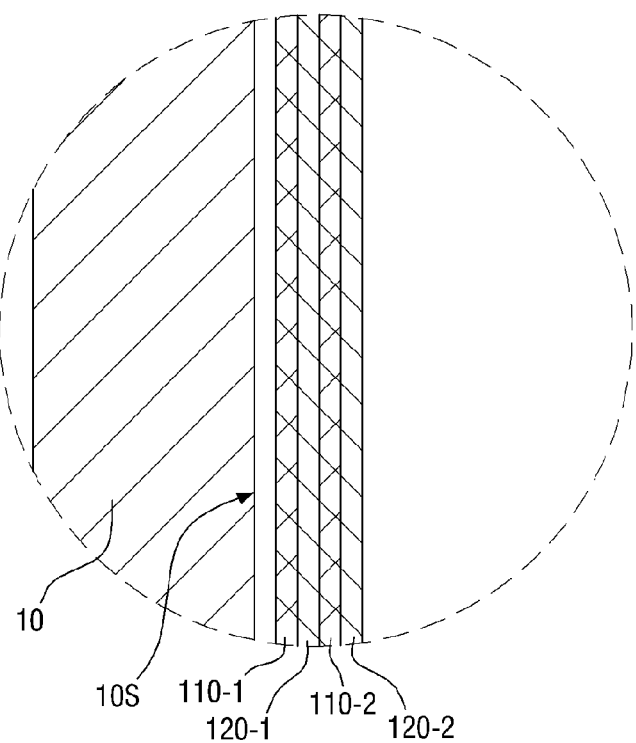
FIG. 4 is an enlarged view of region A in FIG. 2.

FIG. 1 is a flowchart explaining a method for operating semiconductor manufacturing equipment according to an embodiment of the inventive concept. FIG. 2 is a conceptual cross-sectional view of semiconductor manufacturing equipment according to an embodiment of the inventive concept, and FIG. 3 is a timing diagram explaining a method for operating semiconductor manufacturing equipment according to an embodiment of the inventive concept. FIG. 4 is an enlarged view of region A in FIG. 2. More specifically, FIG. 4 is a view explaining a thin film laminated layer on an inner side surface of a reaction chamber by a method for operating semiconductor manufacturing equipment according to an embodiment of the inventive concept.

Referring to FIGS. 1 and 2, a first substrate 100 is loaded on a substrate loading portion 20 in a reaction chamber 10 (S100). That is, the first substrate 100 is drawn into the reaction chamber 10 of semiconductor manufacturing equipment 1.

The first substrate 100 is loaded on the substrate loading portion 20 in a manner that the first substrate 100 is drawn into the reaction chamber 10 through a load lock chamber or a substrate transfer chamber (e.g., transfer module) that is arranged on an outside of the reaction chamber 10.

The first substrate 100 may be made of, for example, bulk silicon or SOI (Silicon-On-Insulator). The substrate 100 may be a silicon substrate or may include another material, for example, silicon germanium, indium antimonide, lead telluride, indium arsenide, indium phosphide, gallium arsenide, or gallium antimonide. Further, the substrate 100 may be obtained by forming an epitaxial layer on a base substrate.

FIG. 2 illustrates that the first substrate 100, i.e., one substrate, is loaded on the substrate loading portion 20, but is not limited thereto.

In the method for operating semiconductor manufacturing equipment according to embodiments of the inventive concept, the semiconductor manufacturing equipment may be, for example, atomic layer deposition (ALD) equipment that performs ALD or chemical vapor deposition (CVD) equipment that performs CVD.

In the following description, the method for operating semiconductor manufacturing equipment will be described under the assumption that the semiconductor manufacturing equipment 1 is ALD equipment that performs ALD.

The semiconductor manufacturing equipment 1 used in embodiments of the inventive concept includes a substrate loading portion 20, a reaction chamber 10, and a gas injection portion 30.

The reaction chamber 10 has a reaction space that is surrounded by inner side walls. The substrate loading portion 20 and the gas injection portion 30 are arranged in the reaction chamber 10. The reaction chamber 10 includes a gateway through which the first substrate 100 can be drawn into the reaction chamber 10. Further, the reaction chamber 10 includes a gas discharge port for discharging reaction gas that remains after being used to form a thin film to a scrubber that is arranged on an outside of the semiconductor manufacturing equipment 1.

The first substrate 100 that is drawn into the reaction chamber 10 is loaded on the substrate loading portion 20. The substrate loading portion 20 may prevent the first substrate 100 from moving during a deposition process by using an electrostatic chuck or vacuum chuck. Further, the substrate loading portion 20 may further include a driving portion that can lift or rotate the first substrate 100. The substrate loading portion 20 may further include a heating portion that can heat the first substrate 100.

The gas injection portion 30 may include an injector portion which injects source gas that is supplied from a raw gas supply portion 40 and process gas that is supplied from a process gas supply portion 50. The injector portion of the gas injection portion 30 may be connected to a rotary shaft to be rotated. The gas that is supplied by the gas injection portion 30 passes the first substrate 100 that is loaded on the substrate loading portion 20 to form a thin film on the first substrate 100.

Further, the gas injection portion 30 may be made in the form of a shower head. In this case, the gas injection portion 30 may inject source gas, process gas, or purge gas into the reaction chamber 10.

Referring to FIGS. 1, 2, and 4, a first conductive thin film 110-1 that includes a first conductive material is formed on the first substrate 100 (S110). While the first conductive thin film 110-1 is formed on the first substrate 100, the first conductive thin film 110-1 is also formed on an inner side surface 10s of the reaction chamber 10 that is exposed to the source gas or the like.

The first conductive thin film 110-1 may include at least one of a metal alloy and a metal carbide. A first metal that is included in the first conductive thin film 110-1, i.e., a first metal that is included in the metal alloy and metal carbide, may include, for example, at least one of Al, Ti, Ta, W, Ni, Nb, Mo, Hf, and La.

The first conductive thin film 110-1 that is formed on the first substrate 100 may be used as a gate electrode of a semiconductor device, for example, a transistor, that is formed on the first substrate 100.

In the case of ALD equipment that performs ALD, a first source gas that forms the first conductive material is supplied to the first substrate 100 through the gas injection portion 30. Through this, the first source gas is adhered to the first substrate 100. Thereafter, the first source gas that is not adhered to the first substrate 100 is discharged to the outside of the reaction chamber 10 by the purge gas that is supplied through the gas injection portion 30. Then, a second source gas that forms the first conductive material is supplied to the first substrate 100 through the gas injection portion 30. The second source gas that is supplied to the first substrate 100 reacts with the first source gas that is adhered to the first substrate 100 to form the first conductive thin film 110-1 that includes the first conductive material on the first substrate 100. Then, the purge gas is supplied through the gas injection portion 30 to discharge the second source gas that has not formed the first conductive thin film 110-1 to the outside of the reaction chamber 10.

The above-described process is repeatedly performed to form the first conductive thin film 110-1 on the first substrate 100 with a desired thickness. The thickness of the first conductive thin film 110-1 may be the thickness of the gate electrode of the transistor.

While the first conductive thin film 110-1 is formed on the first substrate 100, the first conductive thin film 110-1 is also formed on the inner side surface 10s of the reaction chamber 10.

As a specific example, the first conductive material may include TiAlC. A Ti precursor that includes Ti is supplied through the gas injection portion 30. The Ti precursor is adhered to the first substrate 100, and a Ti precursor layer is formed on the first substrate 100. Then, the purge gas, for example, Ar gas, is supplied through the gas injection portion 30 to discharge the Ti precursor that has not been adhered to the first substrate 100 to the outside of the reaction chamber 10. Then, an Al precursor that includes Al is supplied through the gas injection portion 30. The Al precursor reacts on the Ti precursor that is adhered to the first substrate 100 to form a first TiAlC layer 110-1 on the first substrate 100. Since the Al precursor may include carbon, it may not be necessary to additionally supply a source gas that includes carbon. By repeating the above-described process, the first TiAlC layer 110-1 is formed on the first substrate 100 with a desired thickness. The first TiAlC layer 110-1 is also formed on the inner side surface 10s of the reaction chamber 10.

Referring to FIGS. 1 to 3, the first substrate 100 on which the first conductive thin film 110-1 is formed is unloaded from the substrate loading portion 20 to draw the first substrate 100 out of the reaction chamber 10. Then, a first dummy substrate 105 is loaded on the substrate loading portion 20 in the reaction chamber 10 (S120).

The first dummy substrate 105 may include the same material as the first substrate 100, but is not limited thereto. That is, since the first dummy substrate 105 may not be a substrate on which the semiconductor device is manufactured, a material that is used as the first dummy substrate 105 is not limited.

As shown in FIG. 3, in between formation steps of first conductive thin films 110-1 and 110-2 and particle preventive layers 120-1 and 120-2, the first dummy substrate 105 is loaded on the substrate loading portion 20 in the reaction chamber 10.

Referring to FIGS. 1 to 4, the particle preventive layer 120-1 is formed on the inner side surface 10s of the reaction chamber 10 in which the first conductive thin film 110-1 is formed. (S130)

The particle preventive layer 120-1 is formed on the inner side surface 10s of the reaction chamber 10 in which the first conductive thin film 110-1 is formed and on the first dummy substrate 105. That is, the particle preventive layer 120-1 that is formed on the inner side surface 10s of the reaction chamber 10 is formed on the first conductive thin film 110-1.

The particle preventive layer 120-1 may include a second conductive material, and for example, a metal nitride. A second metal that is included in the particle preventive layer 120-1, i.e., a second metal that is included in the metal nitride, may include, for example, at least one of Al, Ti, Ta, W, Ni, Nb, Mo, Hf, and La.

Further, in the method for operating semiconductor manufacturing equipment according to embodiments of the inventive concept, the first metal included in the first conductive material and the second metal included in the second conductive material may be the same metal, but are not limited thereto.

As a specific example, it is assumed that the second conductive material that is included in the particle preventive layer 120-1 includes TiN. A Ti precursor that includes Ti is supplied through the gas injection portion 30. The Ti precursor is adhered to the first TiAlC layer 110-1 that is formed on the inner side surface 10s of the reaction chamber 10 to form a Ti precursor layer on the inner side surface 10s of the reaction chamber 10. Then, the purge gas, for example, Ar gas, is supplied through the gas injection portion 30 to discharge the Ti precursor that has not been adhered to the inner side surface 10s of the reaction chamber 10 to the outside of the reaction chamber 10. Then, a nitrogen source gas is supplied through the gas injection portion 30. The nitrogen source gas reacts on the Ti precursor that is adhered to the first TiAlC layer 110-1 to form a first TiN layer 120-1 on the first TiAlC layer 110-1. That is, the particle preventive layer 120-1 is formed on the inner side surface 10s of the reaction chamber 10. The above-described process is repeated to form the first TiN layer 120-1 on the first TiAlC layer 110-1 with a desired thickness. The first TiN layer 120-1, i.e., the particle preventive layer 120-1, is also formed on the first dummy substrate 105.

In the method for operating semiconductor manufacturing equipment according to an embodiment of the inventive concept, the particle preventive layer 120-1 is formed by performing once a process of loading the first substrate 100 on the substrate loading portion 20, forming the first conductive thin film 110-1 on the first substrate 100, and unloading the first substrate 100 from the substrate loading portion 20.

In the method for operating semiconductor manufacturing equipment according to embodiments of the inventive concept, before and/or after the first conductive thin film 110-1 is formed, a process of dry-cleaning the reaction chamber 10 using a cleaning gas may not be performed, but is not limited thereto. That is, the inner side surface 10s of the reaction chamber 10 may not be cleaned through the dry cleaning. Since the particle preventive layer 120-1 is formed on the first conductive thin film 110-1 to suppress generation of particles in the reaction chamber 10, it is not necessary to perform dry cleaning of the inner side surface 10s of the reaction chamber 10.

Then, the first dummy substrate 105 on which the particle preventive layer 120-1 is formed is unloaded from the substrate loading portion 20 and is drawn out of the reaction chamber 10.

Referring to FIGS. 1, 2, and 4, for repair and maintenance of the semiconductor manufacturing equipment 1, it is determined whether to overhaul the semiconductor manufacturing equipment 1 (S140).

In order to prevent particles from being generated during operation of the semiconductor manufacturing equipment 1, particle preventive layers 120-1 and 120-2 are formed on the inner side surface 10s of the reaction chamber 10. However, if the accumulated thickness of the particle preventive layers 120-1 and 120-2 and the conductive thin films 110-1 and 110-2, which are formed on the inner side surface 10s of the reaction chamber 10, becomes equal to or larger than a predetermined thickness, the particles may be generated to exceed a level of control during the operation of the semiconductor manufacturing equipment, even though the particle preventive layers 120-1 and 120-2 are formed.

Accordingly, if the accumulated thickness of the particle preventive layers 120-1 and 120-2 and the conductive thin films 110-1 and 110-2 is equal to or larger than a predetermined thickness as a result of confirming the operation history of the semiconductor manufacturing equipment, it becomes necessary to overhaul the semiconductor manufacturing equipment 1.

If it is unnecessary to overhaul the semiconductor manufacturing equipment 1, the processes S100 to S130 as illustrated in FIG. 1 are repeatedly performed.

Referring to FIGS. 1 and 2, a second substrate 100 is loaded on the substrate loading portion 20 in the reaction chamber 10 (S100). That is, the second substrate 100 is drawn into the reaction chamber 10 of semiconductor manufacturing equipment 1. The second substrate 100 may not be the first substrate 100 on which the first conductive thin film 110-1 is formed.

Since the explanation of the second substrate 100 overlaps the explanation of the first substrate 100 as described above, the duplicate explanation thereof will be omitted.

Referring to FIGS. 1, 2, and 4, a second conductive thin film 110-2 is formed on the second substrate 100 (S110).

The second conductive thin film 110-2 may include at least one of a metal alloy and a metal carbide. The second conductive thin film 110-2 may include a first conductive material like the first conductive thin film 110-1. The first metal that is included in the second conductive thin film 110-2, i.e., the first metal that is included in the metal alloy and metal carbide, may include, for example, at least one of Al, Ti, Ta, W, Ni, Nb, Mo, Hf, and La.

As a specific example, the second conductive thin film 110-2 may include TiAlC. A Ti precursor that includes Ti is supplied through the gas injection portion 30. The Ti precursor is adhered to the second substrate 100 and the first TiN layer 120-1 that is formed on the inner side surface 10s of the reaction chamber 10, and a Ti precursor layer is formed on the second substrate 100 and the inner side surface 10s of the reaction chamber 10. Then, a purge gas, for example, Ar gas, is supplied through the gas injection portion 30 to discharge the Ti precursor that has not been adhered to the second substrate 100 and the first TiN layer 120-1 to the outside of the reaction chamber 10. Then, an Al precursor that includes Al is supplied through the gas injection portion 30. The Al precursor reacts on the Ti precursor that is adhered to the second substrate 100 and the first TiN layer 120-1 to form a second TiAlC layer 110-2 on the second substrate 100 and the inner side surface 10s of the reaction chamber 10. By repeating the above-described process, the second TiAlC layer 110-2 is formed on the second substrate 100 with a desired thickness. The second TiAlC layer 110-2 is also formed on the inner side surface 10s of the reaction chamber 10.

Referring to FIGS. 1 to 3, the second substrate 100 on which the second conductive thin film 110-2 is formed is unloaded from the substrate loading portion 20 to draw the second substrate 100 out of the reaction chamber 10. Then, a second dummy substrate 105 is loaded on the substrate loading portion 20 in the reaction chamber 10 (S120).

Referring to FIGS. 1 to 4, a particle preventive layer 120-2 is formed on the inner side surface 10s of the reaction chamber 10 on which the first conductive thin film 110-1, the particle preventive layer 120-1, and the second conductive thin film 110-2 are successively formed (S130). Further, the particle preventive layer 120-2 is formed on the second dummy substrate 105.

The particle preventive layer 120-2 may include a second conductive material, and for example, a metal nitride. The second metal that is included in the particle preventive layer 120-2, i.e., the second metal that is included in the metal nitride, may include, for example, at least one of Al, Ti, Ta, W, Ni, Nb, Mo, Hf, and La.

As a specific example, it is assumed that the second conductive material that is included in the particle preventive layer 120-2 includes TiN. The particle preventive layer 120-2 may be a second TiN layer 120-2, and the second TiN layer 120-2 is formed on the inner side surface 10s of the reaction chamber 10 in which the first TiAlC layer 110-1, the first TiN layer 120-1, and the second TiAlC layer 110-2 are successively laminated, and on the second dummy substrate 105.

Referring to FIGS. 3 and 4, a method for operating semiconductor manufacturing equipment according to an embodiment of the inventive concept will be briefly described.

The method for operating semiconductor manufacturing equipment according to an embodiment of the inventive concept completes one cycle by performing once a process of forming a conductive thin film and a process of forming a particle preventive layer. In one cycle, the conductive thin film is once formed and the particle preventive layer is once formed.

That is, the conductive thin films 110-1 and 110-2 and the particle preventive layers 120-1 and 120-2 are alternately formed on the inner side surface 10s of the reaction chamber 10. The respective thicknesses of the conductive thin films 110-1 and 110-2 may be thicknesses that are used for the gate electrode of the transistor.

Referring to FIGS. 2, 5 to 8, a method for operating semiconductor manufacturing equipment according to another embodiment of the inventive concept will be described. For convenience, explanation will be made focusing mainly on different aspects from that as described above with reference to FIGS. 1 to 4.

Figure 5:
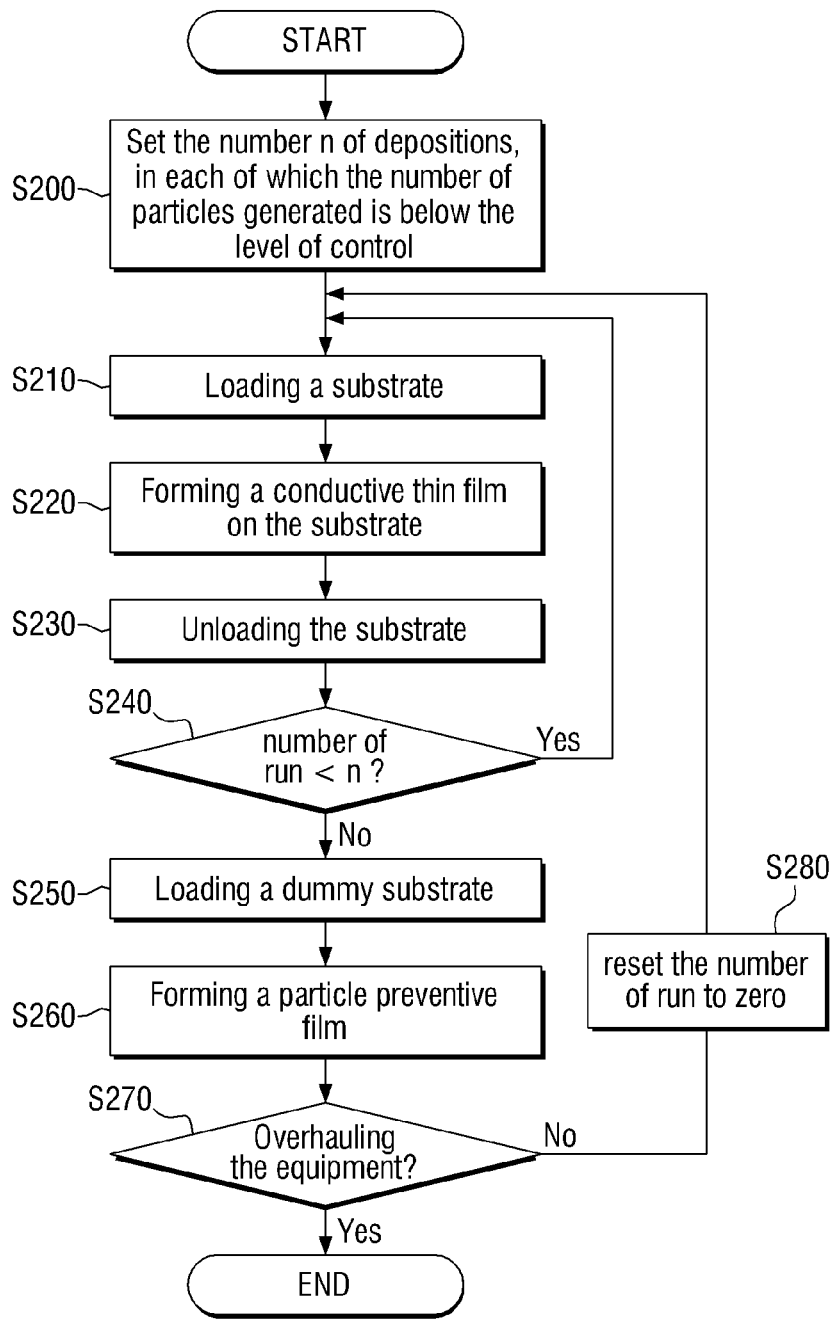
FIG. 5 is a flowchart explaining a method for operating semiconductor manufacturing equipment according to another embodiment of the inventive concept.
Figure 6:
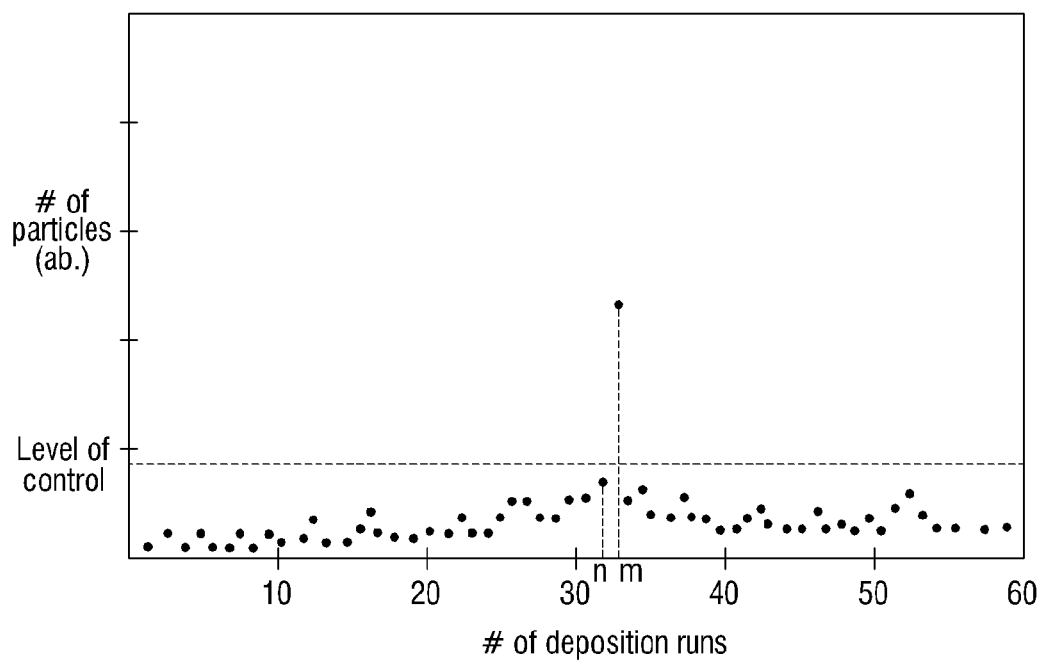
FIG. 6 is a conceptual diagram of equipment operation management explaining S200 in FIG. 5.
Figure 7:
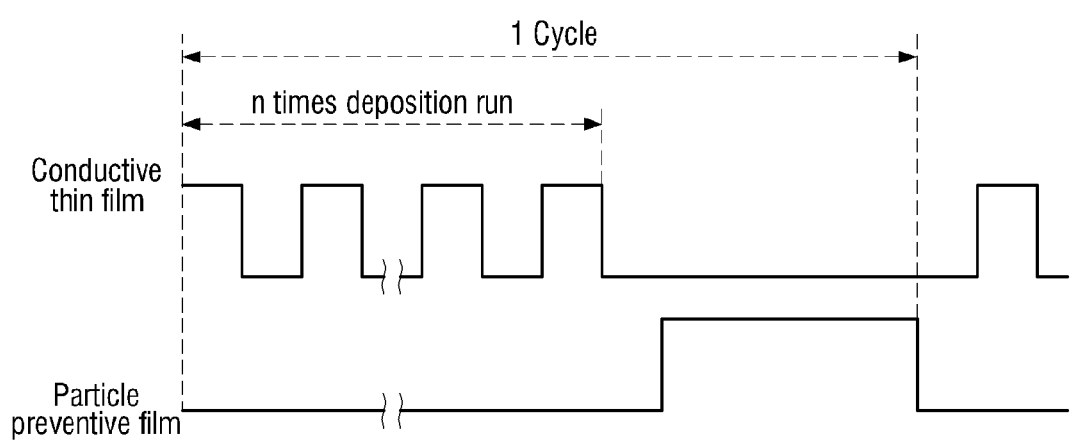
FIG. 7 is a timing diagram explaining a method for operating semiconductor manufacturing equipment according to another embodiment of the inventive concept.
Figure 8:
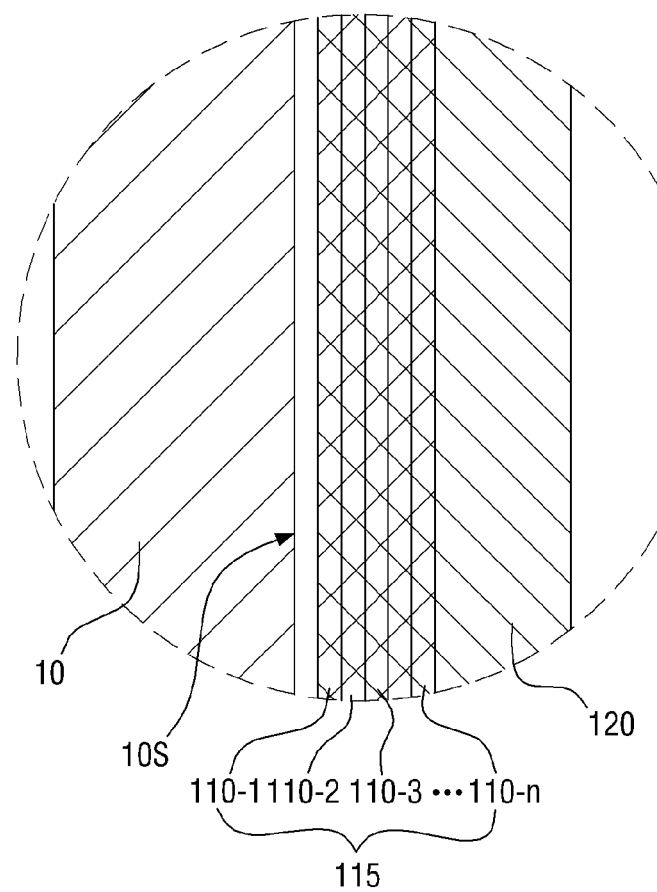
FIG. 8 is a view explaining a thin film laminated layer on an inner side surface of a reaction chamber by a method for operating semiconductor manufacturing equipment according to another embodiment of the inventive concept.

FIG. 5 is a flowchart explaining a method for operating semiconductor manufacturing equipment according to another embodiment of the inventive concept, and FIG. 6 is a conceptual diagram of equipment operation management explaining S200 in FIG. 5. FIG. 7 is a timing diagram explaining a method for operating semiconductor manufacturing equipment according to another embodiment of the inventive concept, and FIG. 8 is a view explaining a thin film laminated layer on an inner side surface of a reaction chamber by a method for operating semiconductor manufacturing equipment according to another embodiment of the inventive concept. More specifically, FIG. 6 is a diagram illustrating a record of the number of particles that are generated in respective deposition processes after the semiconductor manufacturing equipment is operated.

Referring to FIGS. 2, 5, and 6, the number n of deposition processes, in which the number of particles generated is below a level of control, is determined (S200).

By measuring the number of particles that are generated during a deposition process for forming a conductive thin film, the state of the semiconductor manufacturing equipment 1 can be checked. That is, a graph that records the number of particles generated in each deposition process is one kind of data for checking the state of the semiconductor manufacturing equipment 1.

The number of particles generated in each deposition process should be kept below the level of control that is determined by a user. If the number of particles generated in each deposition process exceeds the level of control, the deposition process in which the particles are generated to exceed the level of control may be classified as an inferior process, and in this case, overhauling of the semiconductor manufacturing equipment may be required.

If the number of particles generated in each deposition process exceeds the level of control as described above, production yield of semiconductor devices that are manufactured through the deposition processes may be abruptly decreased. Accordingly, by preventing such an inferior process in advance, the production yield of semiconductor devices that are manufactured through the deposition processes can be maintained or improved.

Hereinafter, determination of the number n of deposition processes in which the number of particles generated is kept below the level of control will be described.

After each deposition process for forming a conductive thin film is performed, the number of particles that are generated in the deposition process is measured. Thereafter, a graph that can represent the relationship between the number of deposition processes and the number of particles generated is made. FIG. 6 may show an example of a graph that can represent the relationship between the number of deposition processes and the number of particles generated.

In FIG. 6, until the number of deposition processes for forming a conductive thin film becomes n, the number of particles generated during the deposition process is kept below the level of control. However, if the number of deposition processes for forming a conductive thin film becomes m (here, m is a natural number that is equal to or larger than 3), the number of particles generated during the deposition process exceeds the level of control. Here, the particles may be a part of conductive thin films laminated on the inner side surface of the reaction chamber 10 through the accumulated deposition processes, but are not limited thereto.

More specifically, if a process of loading the substrate 100 on the substrate loading portion 20, forming the conductive thin film, and unloading the substrate 100 from the substrate loading portion 20 is repeated m times, the number of particles generated during the deposition processes exceeds the level of control. That is, since the number of particles generated during the deposition process is below the level of control after the process of loading the substrate 100 on the substrate loading portion 20, forming the conductive thin film, and unloading the substrate 100 from the substrate loading portion 20 is repeated m−1 times, the number of particles generated until the deposition process is repeated m−1 times exerts less influence on the process stability.

Accordingly, the number n of deposition processes, in which the number of particles generated is in the level of control, is determined as m−1.

As the number of operations of the semiconductor manufacturing equipment 1 is increased, the number n of deposition processes, in which the number of particles generated is below the level of control, may be somewhat changed. Accordingly, by using a statistical method about a plurality of values n being obtained through increasing the number of operations of the semiconductor manufacturing equipment 1, it becomes possible to determine the value n that can maximize the production yield of the semiconductor device and the operation efficiency of the semiconductor manufacturing equipment.

Referring to FIGS. 2 and 5, the first substrate 100 is loaded on the substrate loading portion 20 in the reaction chamber 10 (S210). That is, the first substrate 100 is drawn into the reaction chamber 10 of the semiconductor manufacturing equipment 1.

Referring to FIGS. 2, 5, and 8, the first conductive thin film 110-1 that includes the first conductive material is formed on the first substrate 100 (S220). While the first conductive thin film 110-1 is formed on the first substrate 100, the first conductive thin film 110-1 is also formed on the inner side surface 10s of the reaction chamber 10 that is exposed to the source gas or the like.

As a specific example, it is assumed that the first conductive thin film 100-1 includes a TiAlC layer. A first TiAlC layer 110-2 is formed on the first substrate 100 and the inner side surface 10s of the reaction chamber 10.

Referring to FIGS. 2, 5, and 8, the first substrate 100 on which the first conductive thin film 110-1 is formed is unloaded from the substrate loading portion 20 to draw the first substrate 100 out of the reaction chamber 10 (S230).

Further, it is determined whether the number of deposition processes for forming the conductive thin films 110-1, 110-2, 110-3, and 110-n is smaller than n (S240).

If the number of deposition processes for forming the conductive thin films 110-1, 110-2, 110-3, and 110-n is equal to or larger than n, the particle preventive layer 120 is formed to reduce the generation of the particles during the deposition process.

However, if the number of deposition processes for forming the conductive thin films 110-1, 110-2, 110-3, and 110-n is smaller than n, there is high possibility that the number of particles generated during the deposition process is below the controllable level although an additional deposition process is performed. Accordingly, a process for forming additional conductive thin films 110-2, 110-3, and 110-n is performed.

Referring to FIGS. 2 and 5, a second substrate 100 is loaded on the substrate loading portion 20 in the reaction chamber 10 (S210).

Referring to FIGS. 2, 5, and 8, a second conductive thin film 110-2 that includes a first conductive material is formed on the second substrate 100 (S220). While the second conductive thin film 110-2 is formed on the second substrate 100, the second conductive thin film 110-2 is also formed on the inner side surface 10s of the reaction chamber 10 in which the first conductive thin film 110-2 is formed.

As a specific example, the second conductive thin film 110-2 may include TiAlC. A Ti precursor that includes Ti is supplied through the gas injection portion 30. The Ti precursor is adhered to the second substrate 100 and the first TiAlC layer 110-1 that is formed on the inner side surface 10s of the reaction chamber 10, and a Ti precursor layer is formed on the second substrate 100 and the inner side surface 10s of the reaction chamber 10. Then, a purge gas, for example, Ar gas, is supplied through the gas injection portion 30 to discharge the Ti precursor that has not been adhered to the second substrate 100 and the first TiAlC layer 110-1 to the outside of the reaction chamber 10. Then, an Al precursor that includes Al is supplied through the gas injection portion 30. The Al precursor reacts on the Ti precursor that is adhered to the second substrate 100 and the first TiAlC layer 110-1 to form a second TiAlC layer 110-2 on the second substrate 100 and the inner side surface 10s of the reaction chamber 10. By repeating the above-described process, the second TiAlC layer 110-2 is formed on the second substrate 100 with a desired thickness. The first TiAlC layer 110-1 and the second TiAlC layer 110-2 are successively formed on the inner side surface 10s of the reaction chamber 10. Further, an additional particle preventive layer 120 is not formed on the first TiAlC layer 110-1 and the second TiAlC layer 110-2.

Then, the second substrate 100 on which the second conductive thin film 110-2 is formed is unloaded from the substrate loading portion 20 to draw the second substrate 100 out of the reaction chamber 10.

By repeatedly performing the deposition process for forming the conductive thin films 110-1, 110-2, 110-3, and 110-4 n times, the first to n-th conductive thin films 110-1 to 110-n are successively formed on the inner side surface 10s of the reaction chamber 10. That is, on the inner side surface 10s of the reaction chamber 10, a conductive thin film 115, which is repeatedly deposited n times, is formed.

Then, referring to FIGS. 2, 5, and 7, a dummy substrate 105 is loaded on the substrate loading portion 20 in the reaction chamber 10 (S250).

Referring to FIGS. 2, 5, 7, and 8, a particle preventive layer 120 is formed on the inner side surface 10s of the reaction chamber 10 in which the first to n-th conductive thin films 110-1 to 110-n are successively formed (S260). That is, the particle preventive layer 120 is formed on the inner side surface 10s of the reaction chamber 10 in which the conductive thin film 115, which is repeatedly deposited n times, is formed.

Further, the particle prevention layer 120 is also formed on the first dummy substrate 105.

The particle preventive layer 120 may include a second conductive material, and for example, a metal nitride. The second metal that is included in the particle preventive layer 120, i.e., the second metal that is included in the metal nitride, may include, for example, at least one of Al, Ti, Ta, W, Ni, Nb, Mo, Hf, and La. The second metal may be the same as the first metal that is included in the first to n-th conductive thin films 110-1 to 110-n, but is not limited thereto.

As a specific example, it is assumed that the second conductive material that is included in the particle preventive layer 120 includes TiN. The particle preventive layer 120 may be a TiN layer, and the TiN layer 120 is formed on the conductive thin film 115, which is repeatedly deposited n times and on which the first TiAlC layer 110-1 and the second TiAlC layer 110-2 are successively formed. That is, the TiN layer 120 is formed on the inner side surface 10s of the reaction chamber 10 and on the first dummy substrate 105.

In the method for operating semiconductor manufacturing equipment according to another embodiment of the inventive concept, the thickness of the particle preventive layer 120 is thicker than the respective thicknesses of the particle preventive layers 120-1 and 120-2 as described above with reference to FIGS. 1 to 4.

Referring to FIG. 5, for repair and maintenance of the semiconductor manufacturing equipment 1, it is determined whether to overhaul the semiconductor manufacturing equipment 1 (S270).

If the overhaul of the semiconductor manufacturing equipment 1 is unnecessary, the number of deposition processes for forming the conductive thin film is reset to "0" (S280). Then, the processes S210 to S260 as illustrated in FIG. 5 are repeated.

Referring to FIGS. 7 and 8, a method for operating semiconductor manufacturing equipment according to another embodiment of the inventive concept will be briefly described.

The method for operating semiconductor manufacturing equipment according to another embodiment of the inventive concept completes one cycle by performing once a process of forming a particle preventive layer 120 after repeating n times a process of forming the conductive thin films 110-1, 110-2, 110-3, and 110-n. In one cycle, the conductive thin films 110-1, 110-2, 110-3, and 110-n are formed n times and the particle preventive layer 120 is once formed.

Although embodiments of the inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A production method for semiconductor device manufacturing, the method comprising:
    running deposition processes a number of times n, wherein n is a natural number equal to two or more, and each of the deposition processes includes:
    loading a substrate into a reaction chamber of semiconductor device manufacturing equipment,
    forming an electrically conductive thin film on an inner side surface of the reaction chamber and on the substrate in the reaction chamber, and
    subsequently removing the substrate from the reaction chamber;
    running a respective particle preventing process after at least one of the deposition processes,
    each said respective particle preventing process comprising forming a particle preventive layer on the inner side surface of the reaction chamber such that the particle preventive layer covers at least one conductive thin film formed on the inner side surface of the reaction chamber by the deposition process or processes;
    subsequently shutting down the semiconductor device manufacturing equipment, thereby creating downtime of the equipment; and
    overhauling the semiconductor device manufacturing equipment during the downtime, and
    wherein the running of at least one respective particle preventing process comprises running a particle preventing process of forming a particle preventive layer only after the predetermined number n deposition processes have been run,
    wherein n is a natural number that is equal to or greater than 2, such that respective ones of the electrically conductive thin films are built up one directly on another on the side surface of the reaction chamber before the particle preventive layer is formed thereover.

2. The method of claim 1, wherein the electrically conductive thin film is formed of material including at least one metal and selected from the group consisting of metal alloys and metal carbides.

3. The method of claim 1, wherein the particle preventive layer comprises electrically conductive material.

4. The method of claim 1, wherein the running of the deposition processes the predetermined number of times n and the running of the respective particle preventing process thereafter is one cycle of operation in the method, and
wherein the cycle is performed m−1 times before the operation of the semiconductor device manufacturing equipment is ever terminated to create downtime for the overhauling of the semiconductor device manufacturing equipment,
wherein m is a predetermined natural number based on data showing that particles generated in the reaction chamber exceed a level of control after the deposition process has been run m times, and
wherein m is equal to or greater than 3.

5. The method of claim 1, further comprising loading a dummy substrate in the reaction chamber between one of the deposition processes of forming the electrically conductive thin film and the particle preventing process of forming the particle preventive layer, and leaving the dummy substrate in the reaction chamber during the particle preventing process,
wherein the particle preventing process includes forming the particle preventive layer on the dummy substrate.

6. The method of claim 1, wherein the semiconductor manufacturing equipment is one of atomic layer deposition equipment and chemical vapor deposition equipment.

7. The method of claim 1, wherein the shutting down of the semiconductor device manufacturing equipment is based on a correlation between particles generated in the reaction chamber and a collective thickness of the conductive thin films and the particle preventive layer or layers formed on the inner side surface of the reaction chamber, such that the deposition and the particle preventing processes are run until the conductive thin films and the particle preventive layer or layers, collectively, are formed to a predetermined thickness on the inner side surface of the reaction chamber.

8. The method of claim 2, wherein each said at least one metal is selected from the group consisting of Al, Ti, Ta, W, Ni, Nb, Mo, Hf, and La.

9. The method of claim 4, wherein the conductive material of the particle preventive layer is a metal nitride.

10. The method of claim 9, wherein the metal nitride is a nitride of a metal selected from the group consisting of Al, Ti, Ta, W, Ni, Nb, Mo, Hf, and La.

11. The method of claim 9, wherein the electrically conductive thin film is formed of material including a metal and selected from the group consisting of metal alloys and metal carbides, and
wherein the metal of the electrically conductive thin film is the same metal as the metal of the metal nitride of the particle preventive layer.

12. The method of claim 9, wherein the electrically conductive thin film is formed of a TiAlC and the particle preventive layer is formed of TiN.

13. A production method for semiconductor device manufacturing, the method comprising:
loading a first substrate on a substrate loading portion in a reaction chamber;
forming a first TiAlC layer on an inner side surface of the reaction chamber and on the first substrate in the reaction chamber;
unloading the first substrate on which the first TiAlC layer is formed from the substrate loading portion to draw the first substrate out of the reaction chamber;
loading a first dummy substrate on the substrate loading portion;
forming a first TiN layer on the first dummy substrate and on the first TiAlC layer formed on the inner side surface of the reaction chamber;
unloading the first dummy substrate on which the first TiN layer is formed from the substrate loading portion to draw the first dummy substrate out of the reaction chamber;
loading a second substrate on the substrate loading portion in the reaction chamber;
forming a second TiAlC layer on the inner side surface of the reaction chamber and on the second substrate in the reaction chamber;
unloading the second substrate on which the second TiAlC layer is formed from the substrate loading portion to draw the second substrate out of the reaction chamber;
loading a second dummy substrate on the substrate loading portion; and
forming a second TiN layer on the second dummy substrate and on the inner side surface of the reaction chamber in which the first TiAlC layer, the first TiN layer and the second TiAlC layer are successively formed.

14. A production method for semiconductor device manufacturing, the method comprising: loading a first substrate on a substrate loading portion in a reaction chamber;
forming a first TiAlC layer on an inner side surface of the reaction chamber and on a first substrate in the reaction chamber by an atomic layer deposition process;
unloading the first substrate on which the first TiAlC layer is formed from the substrate loading portion to draw the first substrate out of the reaction chamber;
loading a first dummy substrate on the substrate loading portion;
forming a first TiN layer on the first dummy substrate and on the first TiAlC layer formed on the inner side surface of the reaction chamber by an atomic layer deposition process; and
further comprising, between the drawing the first substrate to an outside and the loading the first dummy substrate:
loading a second substrate on the substrate loading portion in the reaction chamber,
forming a second TiAlC layer on the second substrate in the reaction chamber by an atomic layer deposition process, and
unloading the second substrate on which the second TiAlC layer is formed from the substrate loading portion to draw the second substrate out of the reaction chamber,
wherein the first TiN layer is formed on the inner side surface of the reaction chamber in which the first TiAlC layer and the second TiAlC layer are successively formed.

* * * * *